United States Patent
Liu et al.

(10) Patent No.: US 7,919,769 B2
(45) Date of Patent: Apr. 5, 2011

(54) THREE-DIMENSIONAL ILLUMINATORS

(75) Inventors: Yong-Shan Liu, Shenzhen (CN);
Xiao-Hai Zheng, Shenzhen (CN)

(73) Assignees: Innocom Technology (Shenzhen) Co., Ltd., Shenzhen, Guangdong Province (CN); Chimei Innolux Corporation, Miao-Li County (TW)

( * ) Notice: Subject to any disclaimer, the term of this patent is extended or adjusted under 35 U.S.C. 154(b) by 306 days.

(21) Appl. No.: 12/220,162

(22) Filed: Jul. 21, 2008

(65) Prior Publication Data

US 2008/0315218 A1   Dec. 25, 2008

(30) Foreign Application Priority Data

Jun. 20, 2007   (TW) ................................ 96126527 A

(51) Int. Cl.
*H01L 29/06*   (2006.01)
(52) U.S. Cl. .............. 257/13; 257/86; 257/98; 257/101; 257/E25.032; 362/84

(58) Field of Classification Search .................. None
See application file for complete search history.

(56) References Cited

U.S. PATENT DOCUMENTS

| | | | |
|---|---|---|---|
| 6,049,092 A | 4/2000 | Konuma et al. | |
| 6,350,682 B1 | 2/2002 | Liao | |
| 2005/0110032 A1* | 5/2005 | Saito et al. | 257/98 |
| 2005/0230691 A1* | 10/2005 | Amiotti et al. | 257/79 |

FOREIGN PATENT DOCUMENTS

CN          2755784 Y      2/2006

* cited by examiner

*Primary Examiner* — Evan Pert
*Assistant Examiner* — Scott Wilson
(74) *Attorney, Agent, or Firm* — Wei Te Chung

(57) ABSTRACT

An exemplary illuminator includes a first electrode, a second electrode, and a light-emitting chip. The light-emitting chip includes light-emitting layers arranged three-dimensionally. The first and second electrodes are configured for providing different voltages to the light-emitting chip, and the light-emitting chip is capable of emitting light simultaneously along all dimensional axes.

20 Claims, 4 Drawing Sheets

THREE-DIMENSIONAL ILLUMINATORS

FIELD OF THE INVENTION

The present invention relates to illuminators, and more particularly to an illuminator having a cubic light-emitting structure.

GENERAL BACKGROUND

Currently, illuminators are widely employed in devices such as portable computers, liquid crystal displays, cell phones, as well as traffic lights, spot lights, and other devices.

Referring to FIG. 5 and FIG. 6, a typical illuminator 10 includes a light-emitting chip 13, a first electrode 11, a second electrode 12, and a transparent shell 14.

The first electrode 11 includes a concave depression 15 defined in a top surface thereof. The concave 15 includes a bottom surface 17 and a side surface 16. The bottom surface 17 has a round rim. The side surface 16 encircles the round rim of the bottom surface 17. The light-emitting chip 13 is disposed on the bottom surface 17. The side surface 16 can reflect light.

Referring also to FIG. 7, the light-emitting chip 13 includes a P-type layer 131, an N-type layer 132 thereunder, and a light-emitting layer 133 interposed therebetween. The P-type layer 131, the light-emitting layer 133, and the N-type layer 132 cooperatively constitute a P-N junction. The N-type layer 132 is electrically adhered to the bottom surface 17, thereby electrically connecting to the first electrode 11. The P-type layer 131 is electrically connected to the second electrode 12 via a wire. The light-emitting chip 13 is substantially cubic.

The first electrode 11 applies a first voltage to the N-type layer 132, and the second electrode 12 applies a second voltage to the P-type layer 131. Light is emitted from the light-emitting layer 133 of light-emitting chip 13, and schematic light paths are shown in FIG. 6. Accordingly, the light can only be emitted from the side surfaces of the light-emitting layer 133 not covered by the P-type layer 131 and the N-type layer 132.

Because the light-emitting layer 133 emits light only from sides thereof, area of illumination is restricted and limited, thus intensity of the light-emitting chip 13 of the illuminator 10 is low.

What is needed, therefore, is an illuminator that can overcome the limitations described.

SUMMARY

In a preferred embodiment, an illuminator includes a first electrode, a second electrode, and a light-emitting chip. The light-emitting chip includes light-emitting layers arranged three-dimensionally. The first and second electrodes are configured for providing different voltages to the light-emitting chip, and the light-emitting chip is capable of simultaneously emitting light upwardly, downwardly and sidewardly.

Other novel features and advantages will become more apparent from the following detailed description when taken in conjunction with the accompanying drawings.

DETAILED DESCRIPTION OF PREFERRED EMBODIMENTS

Reference will now be made to the drawings to describe preferred and exemplary embodiments of the present invention in detail.

Figure 1:
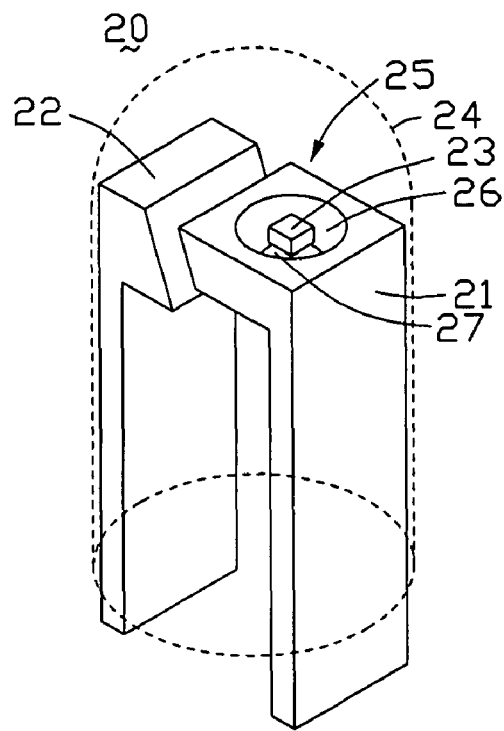
FIG. 1 is an isometric view of an illuminator according to an exemplary embodiment of the present invention, the illuminator including a light-emitting chip, a first electrode and a shell, the shell shown in dashed lines.

Referring to FIG. 1, an isometric view of an illuminator 20 according to a first embodiment of the present invention is shown. The illuminator 20 includes a first electrode 21, a second electrode 11, a light-emitting chip 23 disposed on the first electrode 21, and a transparent shell 24. The light-emitting chip 23 is electrically connected to the first electrode 21 and the second electrode 22 via conductive wires (not shown), respectively. The first electrode 21, the second electrode 22, and the light-emitting chip 23 are substantially received in the shell 24, and shielded from damage thereby. The shell 24 can have a vacuum interior, or be filled with helium, neon, argon, xenon, or a combination of two or more of these gases.

Figure 2:
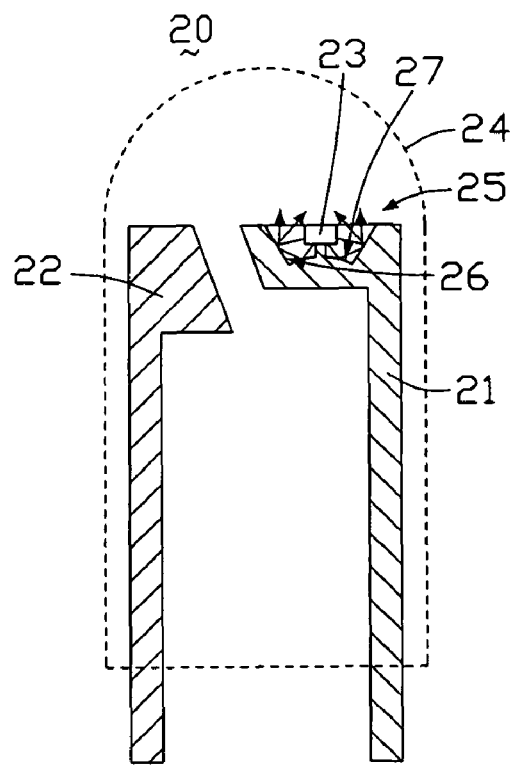
FIG. 2 is a cross-section of the illuminator of FIG. 1.

Referring also to FIG. 2, a cross-section of the illuminator 20 of FIG. 1 is shown. The first electrode 21 and the second electrode 22 are substantially linear. The first electrode 21 has a protruding portion configured to hold the light-emitting chip 23. In the illustrated embodiment, the first electrode 21 has the protruding portion extending perpendicularly from one end thereof, which includes a concave depression 25 defined therein. The concave 25 is substantially defined by a first surface 26 encircling the light-emitting chip 23 and a second surface 27 engaging the first surface on the underside. Both the first surface 26 and the second surface 27 are capable of reflecting light. The second surface 27 is configured to reflect light emitted from the light-emitting chip 23, and the first surface 26 is configured to reflect light emitted from the light chip 23 and light reflected thereto by the second surface 26. The second surface 27 protrudes upwardly.

Figure 3:
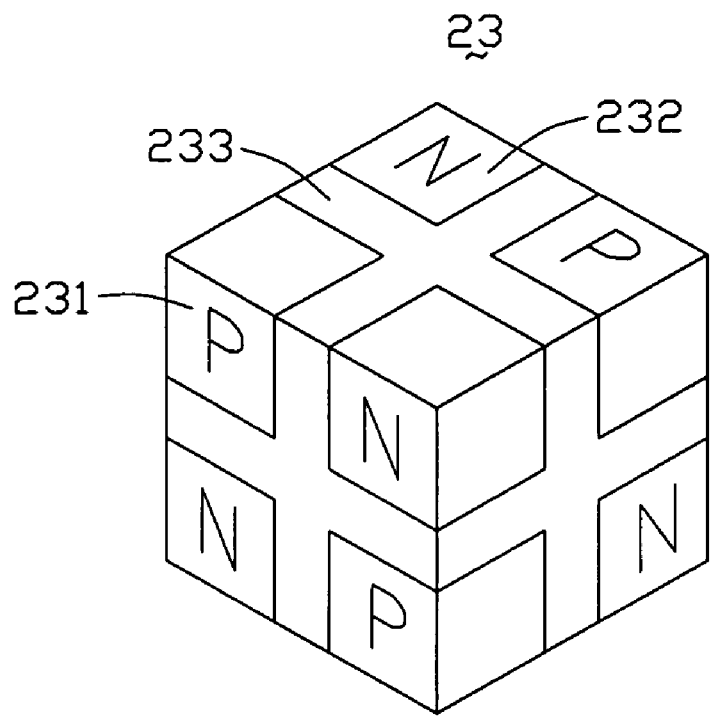
FIG. 3 is an enlarged, isometric view of the light-emitting chip of FIG. 1.

Referring also to FIG. 3, an enlarged, isometric view of the light-emitting chip 23 of FIG. 1 is provided. The light-emitting chip 23 has a cubic structure. In the illustrated embodiment, the light-emitting chip 23 has a substantially cubic structure. The light-emitting chip 23 includes four P-type layers 231 (shown in letter P), four N-type layers 232 (shown in letter N), and a plurality of light-emitting layers 233. The P-type layers 231 and the N-type layers 232 are arranged in the corners of the cube, respectively. The light-emitting layers 233 are interposed between the N-type layer 232 and the P-type layers 231, thereby forming the cubic structure. The P-type layers 231 and the N-type layers 232 are symmetrically disposed at corners along each body diagonal of the cubic structure. One of the P-type layers 231, one of the N-type layers 232 adjacent to the P-type layer 231, and one of the light-emitting layers 233 disposed between the P-type layer 231 and the N-type layer 232 essentially constitute a P-N junction.

Figure 4:
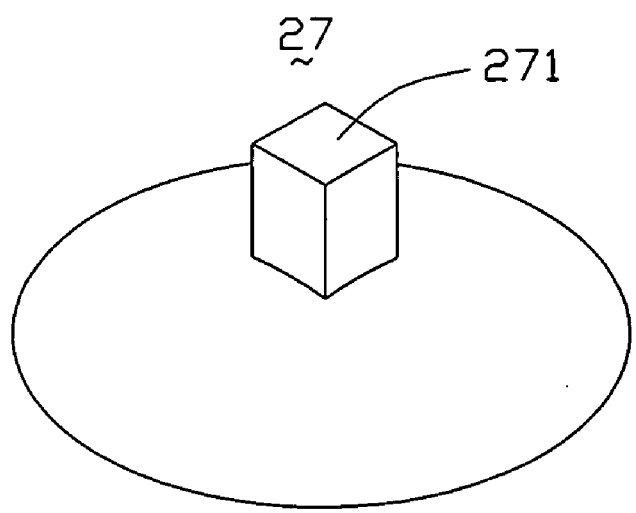
FIG. 4 is an enlarged, isometric view showing a surface of the first electrode of FIG. 1.
Figure 5:
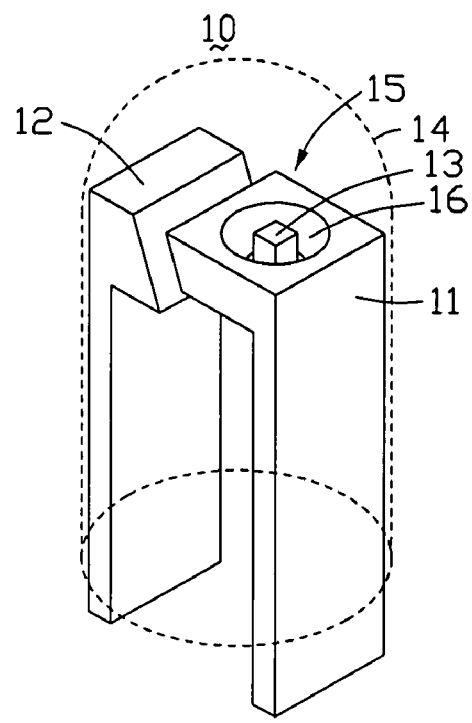
FIG. 5 is a isometric view of a conventional illuminator.
Figure 6:
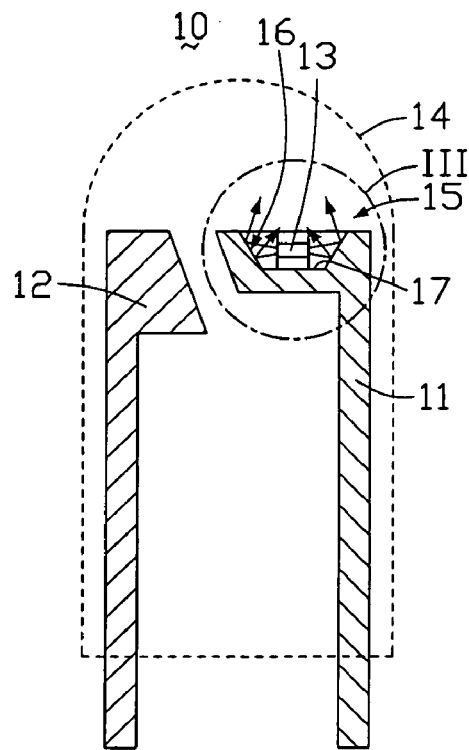
FIG. 6 is a cross-section of the illuminator of FIG. 5.
Figure 7:
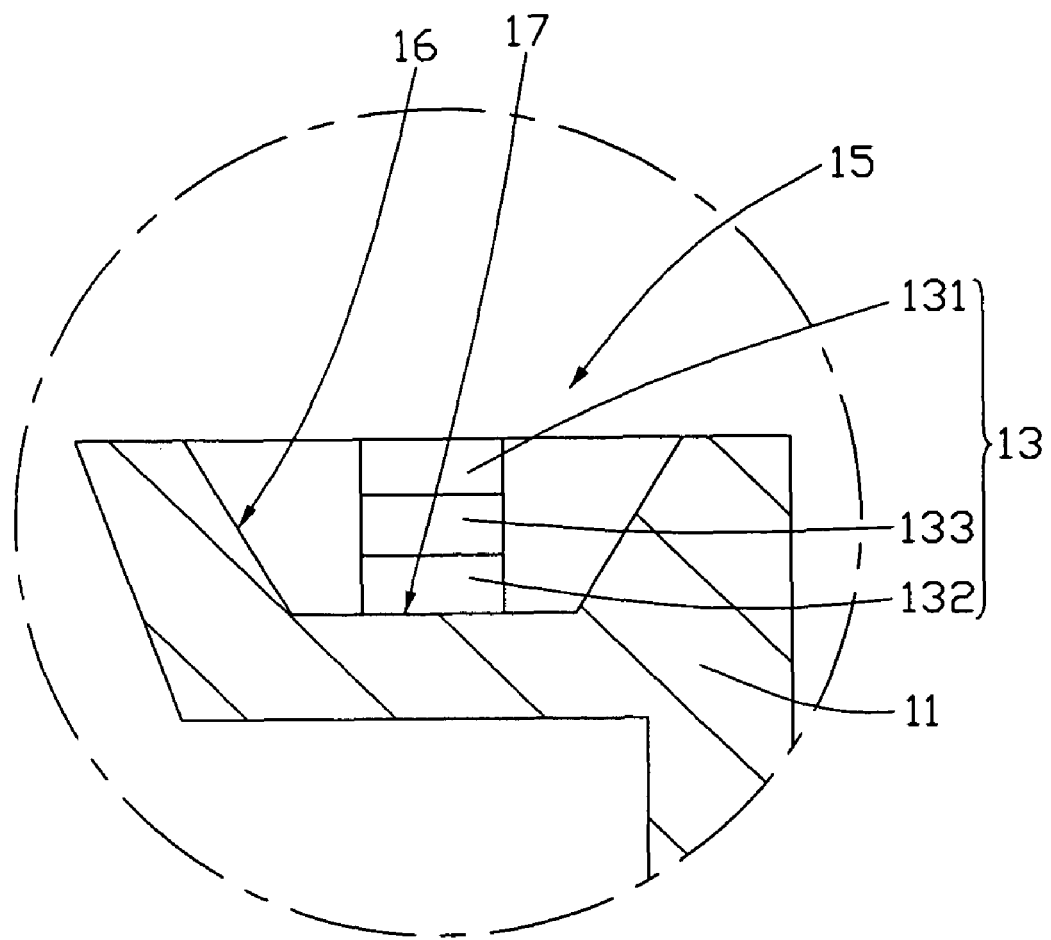
FIG. 7 shows an enlarged view of a circled portion of FIG. 6.

Referring also to FIG. 4, an enlarged isometric view of the second surface 27 is provided. The second surface 27 includes a protrusion 271 extending upwardly. In the illustrated embodiment, the protrusion 271 forms a post. A bottom surface of the light-emitting chip 23 abuts a top surface of the protrusion 271 by adhesion, such that the light-emitting chip 23 is fixed to the second surface 27 of the first electrode 21.

The four P-type layers 231 are electrically connected to the first electrode 21, and the four N-type layers 232 are electrically connected to the second electrode 22. When the illuminator 20 is activated, the first electrode 21 applies a first voltage to the P-type layers 231, and the second electrode 22 applies a second voltage to the N-type layers 232. In the illustrated embodiment, the first voltage exceeds the second voltage. Thus, a current is generated in each P-N junction. The light-emitting layers 233 emit light due to electro-optical effect of the P-N junctions. The light is multi-directionally and spherically emitted from different orientation of the light-emitting chip 23, with each light-emitting layer 233 served as a light-emitting area. Some of the light reaches the first surface 26 directly, and other reaches the second surface 27 and is then reflected to the first surface 26. The light is eventually reflected out through the shell 24. The light-emitting chip 23 emits light from all surfaces of the cubic structure, improving density of light reaching the shell 24 first, such that illuminator 20 provides improved intensity.

In summary, the illuminator 20 includes the light-emitting chip 23 including light-emitting layers 233 in a specific three-dimensional structure, such that light-emitting chip 23 emits light through all three dimensional axes. The illuminator 20 therefore improves intensity of light emission.

In an alternative embodiment, an illuminator can includes a plurality of P-type segments, a plurality of N-type segments and a light emitting segment cooperatively constituting a single unified body in the shape of a parallelepiped. Along an X-axis of a Cartesian system of the light-emitting chip, one of the P-type semiconductor segments is separated from one of the N-type semiconductor segments by the light-emitting segment. Along a Y-axis of the Cartesian system, one of the P-type semiconductor segments is separated from one of the N-type semiconductor segments by the light-emitting segment. Along a Z-axis of the Cartesian system, one of the P-type semiconductor segments is separated from one of the N-type semiconductor segments by the light-emitting segment. When a voltage differential is applied to the light-emitting chip, the light-emitting chip is capable of emitting light simultaneously from all surfaces of the parallelepiped body.

In another alternative embodiment, the second surface can downwardly protrude. In other alternative embodiments, the light-emitting chip 23 can be globular or other spherical configuration, and the second voltage can exceed the first voltage.

It is to be understood, however, that even though numerous characteristics and advantages of preferred embodiments have been set out in the foregoing description, together with details of the structures and functions of the embodiments, the disclosure is illustrative only; and that changes may be made in detail, especially in matters of shape, size, and arrangement of parts within the principles of the present invention to the full extent indicated by the broad general meaning of the terms in which the appended claims are expressed.

What is claimed is:

1. An illuminator comprising:
    a first electrode;
    a second electrode; and
    a light-emitting chip comprising a plurality of light-emitting layers arranged three-dimensionally, and the plurality of light-emitting layers forming at least one light-emitting region at each surface of the light-emitting chip;
    wherein the first and second electrodes are configured for providing different voltages to the light-emitting chip, and the light-emitting chip is capable of simultaneously emitting light from each light-emitting region of the light-emitting chip.

2. The illuminator of claim 1, wherein the light-emitting chip further comprises four P-type layers and four N-type layers, the four P-type layers, the four N-type layers and the plurality of light-emitting layers cooperatively constituting a cubic structure, the four P-type layers and the four N-type layers being symmetrically arranged at corners of the cubic structure along each body diagonal thereof, the plurality of the light-emitting layers being interposed therein between the P-type layers and the N-type layers.

3. The illuminator of claim 1, wherein one P-type layer, one N-type layer adjacent to the P-type layer, and one light-emitting layer between the P-type layer and the N-type layer cooperatively constitute a P-N junction.

4. The illuminator of claim 1, wherein the first electrode applies a first voltage to the four P-type layers, and the second electrode applies a second voltage less than the first voltage to the four N-type layers.

5. The illuminator of claim 1, wherein the first electrode comprises a concave depression, with the light-emitting chip positioned therein.

6. The illuminator of claim 1, wherein the first electrode comprises a first surface and a second surface engaging the first surface, the first and the second surfaces together forming a concave depression with an opening, the second surface configured for reflecting light from the light-emitting chip to the first surface, and the first surface configured for reflecting light from the light-emitting chip and the second surface to the opening of the concave.

7. The illuminator of claim 6, wherein the first surface upwardly protrudes.

8. The illuminator of claim 6, wherein the first surface downwardly protrudes.

9. The illuminator of claim 6, wherein the light-emitting chip is substantially encircled by the first surface and is disposed on the second surface.

10. The illuminator of claim 1, further comprising a transparent shell, wherein the transparent shell receives the first electrode, the second electrode and the light-emitting chip.

11. The illuminator of claim 10, wherein the shell is a vacuum.

12. The illuminator of claim 10, wherein the shell is filled with helium, neon, argon, xenon, or a mixture of two or more of these gases.

13. The illuminator of claim 1, wherein the light-emitting chip is globular.

14. An illuminator comprising a light-emitting chip having a cubic structure, wherein the light-emitting chip is capable of emitting light simultaneously from all surfaces of the cubic structure.

15. The illuminator of claim 14, further comprising a first electrode and a second electrode configured for providing different voltages to the light-emitting chip.

16. The illuminator of claim 15, wherein the first electrode comprises a first surface and a second surface engaging and encircled by the first surface, the first and second surfaces defining a concave depression, the light-emitting chip being disposed on the second surface and surrounded by the first surface.

17. The illuminator of claim 15, wherein the light-emitting chip comprises four P-type layers, four N-type layers, and a plurality of light-emitting layers, the four P-type layers, the four N-type layers and the plurality of light-emitting layers cooperatively constituting the cubic structure, the four P-type layers and the four N-type layers being symmetrically arranged at corners of the cubic structure along each body diagonal thereof, the plurality of the light-emitting layers being interposed therein between the P-type layers and the N-type layers.

18. The illuminator of claim 17, wherein the first electrode is electrically connected to the four P-type layers, and the second electrode is electrically connected to the four N-type layers.

19. A light-emitting chip comprising:
a plurality of P-type semiconductor segments;
a plurality of N-type semiconductor segments; and
a light-emitting segment;
wherein the P-type semiconductor segments, the N-type semiconductor segments, and the light-emitting segment cooperatively constitute a three-dimensional structure;
along an X-axis of a Cartesian system of the light-emitting chip, one of the P-type semiconductor segments is separated from one of the N-type semiconductor segments by the light-emitting segment;
along a Y-axis of the Cartesian system, one of the P-type semiconductor segments is separated from one of the N-type semiconductor segments by the light-emitting segment;
along a Z-axis of the Cartesian system, one of the P-type semiconductor segments is separated from one of the N-type semiconductor segments by the light-emitting segment; and
when a voltage differential is applied to the light-emitting chip, the light-emitting chip is capable of emitting light simultaneously from each surface of the three-dimensional structure.

20. The light-emitting chip of claim 19, wherein the three-dimensional structure is a parallelepiped.

* * * * *